(12) United States Patent
McCormick et al.

(10) Patent No.: US 8,580,044 B2
(45) Date of Patent: Nov. 12, 2013

(54) APPARATUS FOR AGITATING AND EVACUATING BYPRODUCT DUST FROM A SEMICONDUCTOR PROCESSING CHAMBER

(75) Inventors: Eric McCormick, Round Rock, TX (US); Rolando Mendez, Austin, TX (US); Bradley May, Austin, TX (US)

(73) Assignees: Samsung Austin Semiconductor, L.P., Austin, TX (US); Samsung Electronics Co., Ltd., Suwon-si (KR)

( * ) Notice: Subject to any disclaimer, the term of this patent is extended or adjusted under 35 U.S.C. 154(b) by 377 days.

(21) Appl. No.: 12/806,464

(22) Filed: Aug. 13, 2010

(65) Prior Publication Data

US 2012/0037188 A1    Feb. 16, 2012

(51) Int. Cl.
*B08B 5/04*     (2006.01)
*B08B 9/00*     (2006.01)

(52) U.S. Cl.
USPC ............ 134/21; 134/22.1; 134/24; 134/37; 134/104.2; 134/166 R; 134/167 R

(58) Field of Classification Search
None
See application file for complete search history.

(56) References Cited

U.S. PATENT DOCUMENTS

| | | | | |
|---|---|---|---|---|
| 2006/0234514 | A1* | 10/2006 | Gianoulakis et al. | 438/758 |
| 2008/0202416 | A1* | 8/2008 | Provencher et al. | 118/715 |
| 2008/0236495 | A1* | 10/2008 | Tompa | 118/724 |
| 2008/0299411 | A1* | 12/2008 | Oladeji | 428/620 |

* cited by examiner

*Primary Examiner* — Nicole Blan

(57) ABSTRACT

A system and method for semiconductor processing chamber includes a housing that can cover an annular gap of a pedestal well of the semiconductor processing chamber. A cleaning nozzle is removably coupled to a compressed dry air (CDA) supply. The cleaning nozzle can inject the CDA into the pedestal well while the housing can contain a byproduct dust agitated by the injected CDA. The byproduct dust is evacuated by at least one vacuum port that is removably coupled to a vacuum source.

20 Claims, 5 Drawing Sheets

APPARATUS FOR AGITATING AND EVACUATING BYPRODUCT DUST FROM A SEMICONDUCTOR PROCESSING CHAMBER

TECHNICAL FIELD OF THE INVENTION

The present disclosure relates generally to a chemical vapor deposition (CVD) process, and more specifically to a system and method for cleaning a CVD chamber.

BACKGROUND OF THE INVENTION

Semiconductor processing chambers, such as the 300 mm Novellus Altus chambers, accumulate tungsten dust in the pedestal wells as the chamber operates. Large amounts of this residual dust build up loosely on the bottom side of the pedestals. Currently, removal of this dust is accomplished by spraying compressed dry air (CDA) into the pedestal well, which produces a plume of tungsten dust that permeates throughout the interior and exterior of the chamber. Operators utilize a vacuum hose to capture as much of the tungsten dust as possible as the dust escapes from the chamber well. However, this cleaning method produces a cloud of tungsten dust in an uncontrolled and unpredictable manner. Attempts to slowly spray small amounts of CDA into the well simultaneously with utilizing the vacuum hose to gather the dust as it escapes from the other side of the pedestal have been unsuccessful at controlling the tungsten dust plumes.

Recent studies have indicated that creating the tungsten dust cloud is creates a safety concern and health concern. According to "Explosion Temperatures of Metals and Other Elemental Dust Clouds" by Kenneth L, Cashdollar and Isaac A. Zlochower, the contents of which are hereby incorporated by reference, a tungsten dust cloud consisting of small particles (1-3 μm) has the potential to explode if exposed to an ignition source. Because of the nature of the processing chambers, such as the Altus, the potential for explosion exists. In addition, exposure to contact with the tungsten dust cloud can cause acute health effects such as irritation to the eyes and skin. Irritation to the eyes can include watering and redness. Irritation to the skin can cause skin inflammation such as reddening, scaling, and itching. Inhalation of portions of the tungsten dust cloud can cause irritation to the lungs and mucus membranes.

SUMMARY OF THE INVENTION

An apparatus for cleaning a semiconductor processing chamber is provided. The apparatus includes a housing configured to cover an annular gap of a pedestal well of the semiconductor processing chamber. The apparatus also includes at least one cleaning nozzle configured to inject a gas into the pedestal well. The housing is configured to contain a byproduct agitated by the injected gas. The apparatus further includes at least one vacuum port configured to evacuate the byproduct.

A system for cleaning a semiconductor processing chamber is provided. The system includes a housing configured to cover an annular gap of a pedestal well of the semiconductor processing chamber. The system also includes at least one cleaning nozzle removably coupled to a compressed dry air (CDA) supply. The cleaning nozzle configured to inject CDA into the pedestal well. The housing is configured to contain a byproduct agitated by the injected CDA. The system further includes at least one vacuum port removably coupled to a vacuum source. The vacuum port is configured to evacuate the byproduct.

A method for cleaning a semiconductor processing chamber is provided. The method includes covering an annular gap of a pedestal well of the semiconductor processing chamber. A gas is injected into the pedestal well and a byproduct agitated by the injected gas is contained within the pedestal well. The method also includes evacuating the byproduct.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a better understanding of the disclosure, and to show by way of example how the same may be carried into effect, reference is now made to the detailed description of the disclosure along with the accompanying figures in which corresponding numerals in the different figures refer to corresponding parts and in which.

DETAILED DESCRIPTION OF THE INVENTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Figure 1:
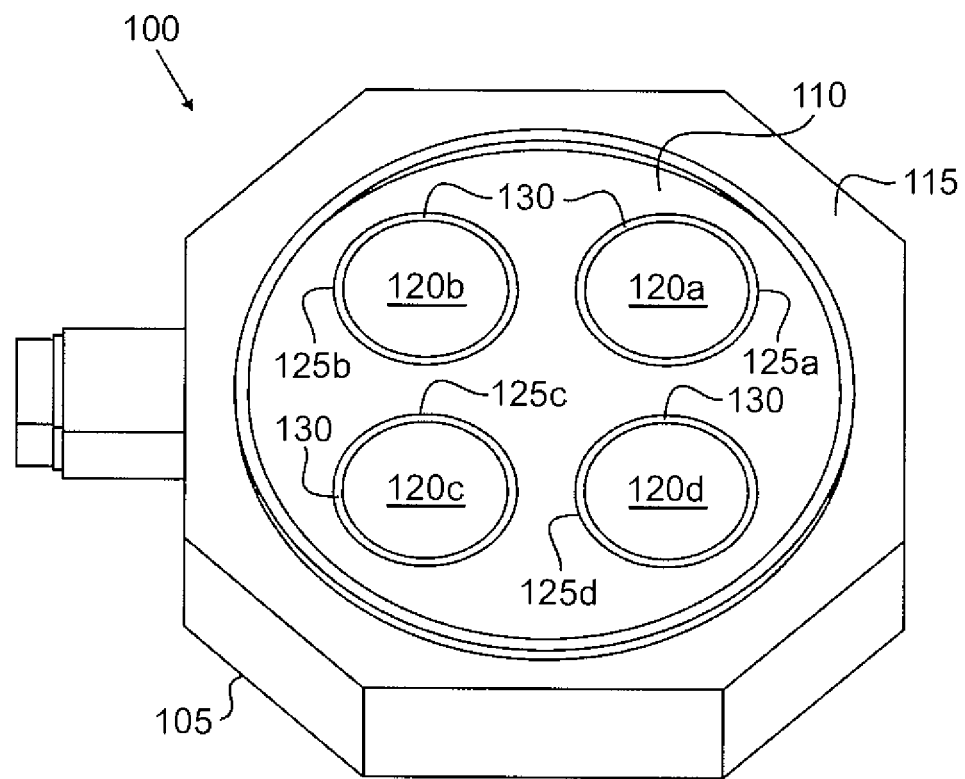
FIG. 1 illustrates an exemplary semiconductor processing chamber according to this disclosure.

FIG. 1 illustrates an exemplary semiconductor processing chamber according to this disclosure. The embodiment of the semiconductor processing chamber 100 shown in FIG. 1 is for illustration only. Other semiconductor processing chambers 100 could be used without departing from the scope of this disclosure. The semiconductor processing chamber 100 can be any multi-station processing chamber such as that disclosed in U.S. Pat. No. 6,319,553, the contents of which are hereby incorporated by reference in their entirety.

The semiconductor processing chamber 100 includes a chamber base 105, a top surface 110 and chamber top 115. In the example shown in FIG. 1, the semiconductor processing chamber also includes four pedestals 120a-d. It will be understood four pedestals are shown for illustration only and that the semiconductor processing chamber 100 can include any number of pedestals without departing from the scope of this disclosure. Each pedestal 120a-d is positioned within a corresponding well 125a-d and includes a showerhead (not illustrated for clarity). The combination of well 125, pedestal 120 and showerhead forms a station within the semiconductor processing chamber 100. The pedestals 120a-d and wells 125a-d are dimensioned such that an annular gap 130 exists between a circumferential edge of the pedestal 120 and the interior wall of the well 125.

Wafers are processed in the pedestals 120. During processing, an indexing plate (not shown) moves the semiconductor wafers from a first plate 120a to a second plate 120b and so forth, such that each wafer is sequentially moved through and processed by each station of the semiconductor processing chamber 100. As the semiconductor processing chamber 100 operates, tungsten dust accumulates in the pedestal wells 125. In addition, large amounts of this residual dust build up loosely on the bottom side of the pedestals 120.

Figure 2:
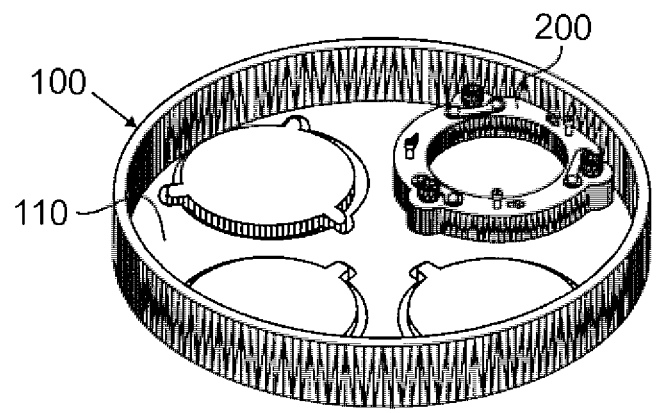
FIG. 2 illustrates a rolandonator coupled to a semiconductor processing chamber according to embodiments of the present disclosure.

FIG. 2 illustrates a rolandonator coupled to a semiconductor processing chamber according to embodiments of the present disclosure. The embodiment shown in FIG. 2 is for illustration only. Other embodiments could be used without departing from the scope of this disclosure.

The rolandonator 200 is a cleaning apparatus that can clean the tungsten dust from the pedestal 120 and well 125 while inhibiting the formation of the tungsten dust cloud outside the semiconductor processing chamber 100. The rolandanator 200 can deliver the CDA, or any other suitable gas, into the well 125 and under and along the side of the pedestal 120. The rolandonator 200 also can capture tungsten stirred-up and released by the CDA. In addition, tungsten particles are inhibited from escaping from the well 125 by the rolandonator 200.

The rolandonator 200 can couple directly to, or otherwise be placed in contact with, the semiconductor processing chamber 100. When coupled to the semiconductor processing chamber 100, the rolandonator 200 can cover the annular gap 130. The rolandonator 200 can form a substantially air-tight seal with the top surface 110 and the pedestal 120 such that the tungsten particles are inhibited from flowing out from the annular gap 130.

Figure 3:
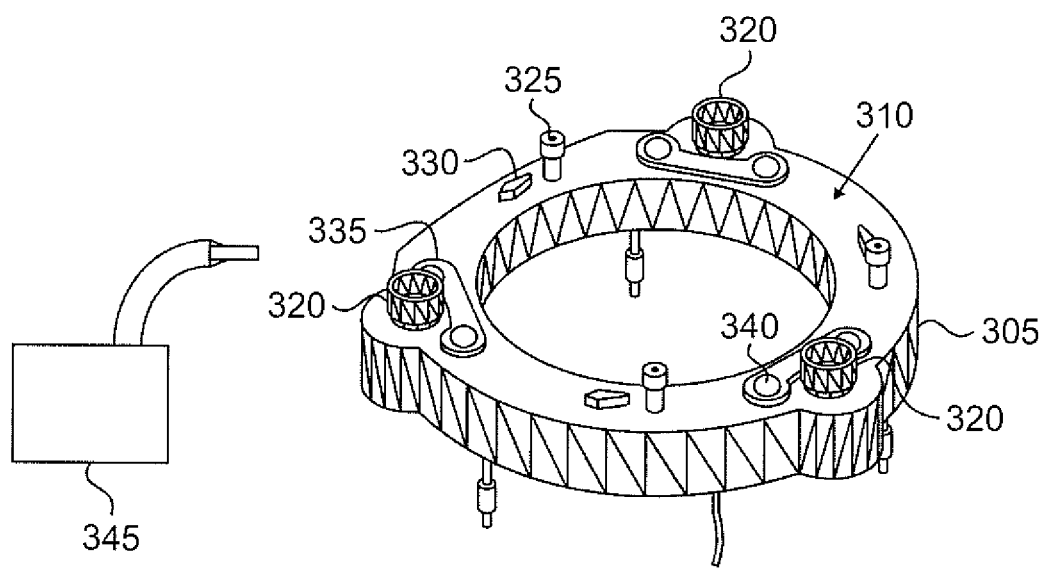
FIGS. 3 through 6 illustrate a rolandonator according to embodiments of the present disclosure.

FIG. 3 illustrates the rolandonator 200 according to embodiments of the present disclosure. The embodiment of the rolandonator 200 shown in FIG. 3 is for illustration only. Other embodiments could be used without departing from the scope of this disclosure.

The rolandonator 200 includes a housing 305. The housing 305 can be aluminum, plastic or any suitable material. The housing includes a control surface 310. The control surface includes a number of vacuum ports 320 and a number of intake ports 325. In the example shown in FIG. 3, the rolandonator 200 includes three vacuum ports 320 and three intake ports 325. It will be understood that although three vacuum ports 320 and three intake ports 325 are shown in FIGS. 3 through 8, the rolandonator 200 can include any number of vacuum ports 320 and any number of intake ports 325 without departing from the scope of this disclosure. In some embodiments, the control surface includes a number of handles (not shown) to facilitate movement (such as placement and removal) of the rolandonator 200.

The intake ports 325 can be coupled via a hose (not shown) to a gas source 345, such as a CDA source. The intake ports 325 are adapted to securely couple to the hose via a fastening means, such as a threading, a pneumatic coupler such as a quick disconnect, universal Coupling, industrial coupler, industrial plug, interchange plug, parker plug, Lincoln plug, mold-coolant plug, and the like. The intake ports 325 include a three-way valve coupled to a respective selector switch 330. The intake ports 325 are adapted to receive the CDA from the hose and deliver the CDA to either a polywhip line or 90° fan, which are discussed further herein below with respect to FIG. 7, as selected by the selector switch 330. Additionally, the intake ports 325 can block flow of the CDA when place in a closed position by the selector switch 330.

The housing 305 includes a number of view ports 335. Each view port 335 can include cover that is Plexiglas®, glass, or the like, disposed over openings 340 (or vias) through the rolandonator 200. The view ports 335 enable an operator to view into the well 125 while conducting a cleaning operation. In the example shown in FIG. 3, the rolandonator 200 includes three view ports 335 disposed adjacent to the vacuum ports 320. However, it will be understood that the rolandonator 200 can include any number of view ports 335, which can be disposed at any position on the rolandonator 200 to facilitate the operator's view into the well 125 while conducting a cleaning operation.

Figure 4:
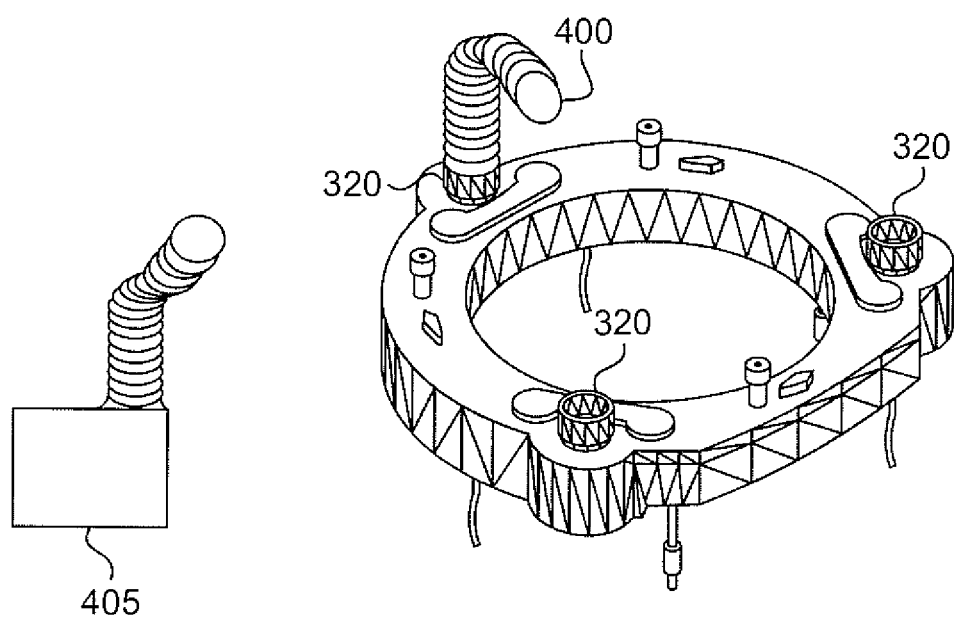

The vacuum port 320 can include fastening means such as a threading, a pneumatic coupler such as a quick disconnect, universal coupling, industrial coupler, industrial plug, interchange plug, parker plug, Lincoln plug, mold-coolant plug, and the like, or be configured as a plumbing port, such as a standard Polyvinyl Chloride (PVC) port. The vacuum ports 320 can couple to a vacuum hose 400, as shown in FIG. 4. In some embodiments, only one vacuum hose 400 is coupled to one of the vacuum ports 320. In some embodiments, one or more of the vacuum ports 320 is coupled to a respective vacuum hose 400. In some embodiments, all the vacuum ports 320 are coupled to a respective vacuum hose 400. In some embodiments wherein more than one vacuum port 320 is couple to a respective vacuum hose 400, the respective vacuum hoses 400 can be coupled together at a junction point and further coupled to a single vacuum source 405. The vacuum ports 320, when coupled to the vacuum source 405 through the vacuum hoses 400, can evacuate the tungsten dust as it is stirred up in the pedestal well 125.

Figure 5:
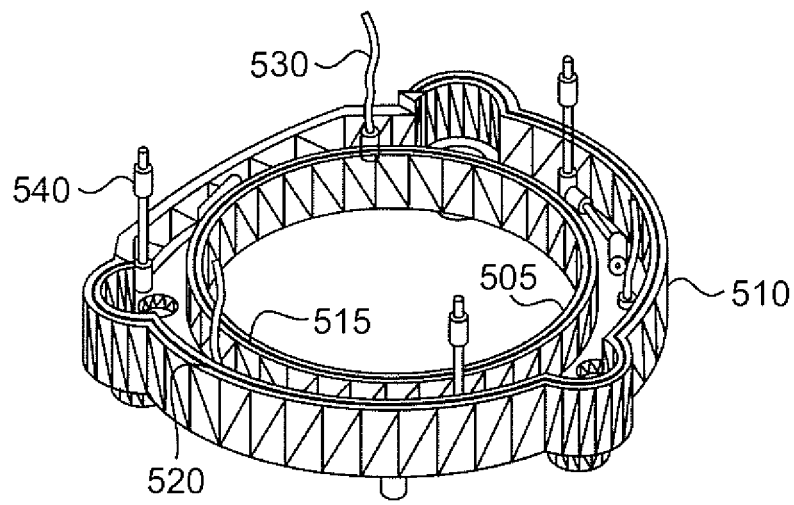

FIG. 5 illustrates a bottom view of the rolandonator according to embodiments of the present disclosure. The embodiment of the rolandonator 200 shown in FIG. 5 is for illustration only. Other embodiments could be used without departing from the scope of this disclosure.

The housing 305 includes an interior wall 505 and an exterior circumferential wall 510. Each wall 505, 510 also includes a high-temperature O-ring 515, 520. The high temperature O-ring 515, 520 is disposed on a bottom of each wall 505, 510. In some embodiments, the high-temperature O-rings 515, 520 are adapted to withstand temperatures up to 100° C. The high temperature O-rings 515, 520 are positioned on each wall 505, 510 to enable an air tight seal when the rolandonator 200 is coupled to the semiconductor processing chamber 100. In some embodiments, as shown in FIG. 5, the O-ring 520 extends along a portion of the bottom of wall 510, that is, leaving a potion of the wall 510 without the O-ring 520. In some embodiments, as shown in FIG. 6, the O-ring 520 extends along the entire portion of the bottom of wall 510.

Figure 6:
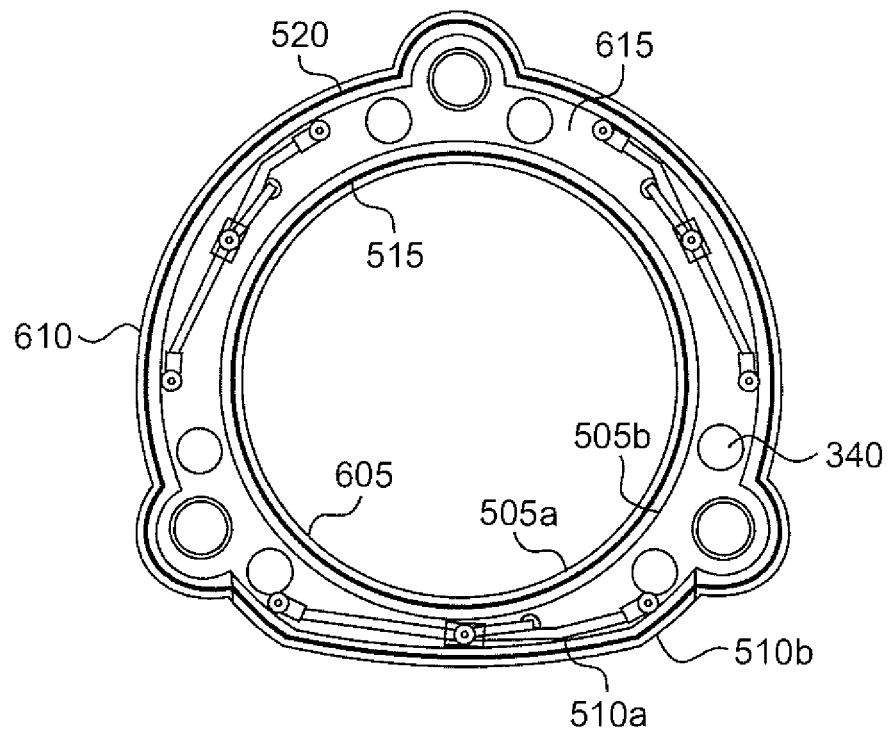

In some embodiments, each circumferential wall 505, 510 includes an inner circumferential wall 505a, 510a and an outer circumferential wall 505b, 510b, as shown in FIG. 6. The inner circumferential wall 505a and the outer circumferential wall 505b are disposed such that a first channel 605 is formed therebetween. In addition, the inner circumferential wall 510a and the outer circumferential wall 510b are disposed such that a second channel 610 is formed therebetween. The high temperature O-ring 515 is disposed within the first gap 605 and the high temperature O-ring 520 is disposed within the first gap 610. The high temperature O-rings 515, 520 are dimensioned to be fit snugly within each gap 605, 610 with a portion of each O-ring 515, 520 protruding from each gap 605, 610 to enable an air tight seal when the rolandonator 200 is coupled to the semiconductor processing chamber 100.

The interior wall 505 and the exterior circumferential wall 510 are positioned to form a channel 615, illustrated in FIG. 6, on the backside of the rolandonator 600. The interior wall 505 and the exterior circumferential wall 510 are dimensioned such that the channel 615 is aligned with the annular gap 130 when the rolandonator 200 is coupled to the semiconductor processing chamber 100. Therefore, the housing 305 can cover the annular gap 305. In addition, the O-rings 515 and 520 are also positioned to form a seal around the annular gap 130. In one embodiment, the rolandonator 200 is dimensioned to securely fit the Novellus Altus® 300 mm processing chamber.

Figure 7:
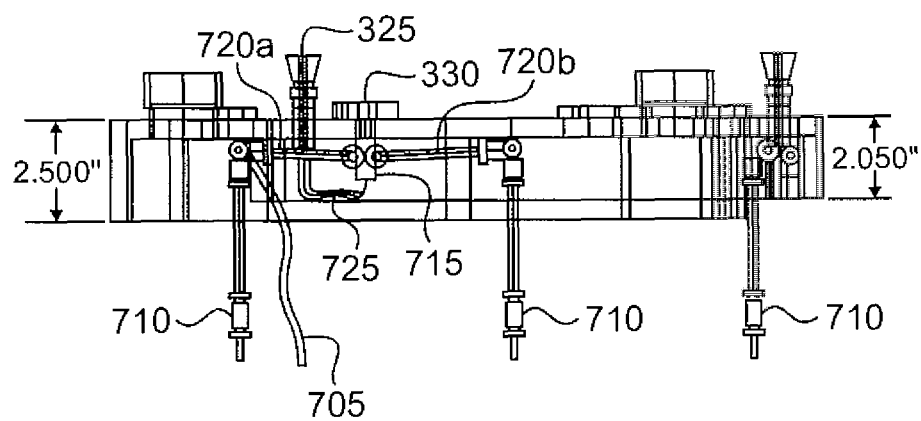
FIG. 7 illustrates a cleaning nozzle assembly according to embodiments of the present disclosure.

FIG. 7 illustrates a cleaning nozzle assembly according to embodiments of the present disclosure. The embodiment of the cleaning nozzle assembly shown in FIG. 7 is for illustration only. Other embodiments could be used without departing from the scope of this disclosure.

The rolandonator 200 includes a number of cleaning nozzles coupled to the inlet ports 325. Each cleaning nozzle can include a polywhip line 705 and a 90° fan 710. The polywhip line 705 and 90° fan 710 couple to the three-way valve 715 via distribution lines 720a-b. The three-way valve 715 couples to the inlet port 325 via a short feeder line 725.

The three-way valve 715 is coupled to and controlled by the selector switch 330. The three-way valve 715 can receive CDA from the inlet port 325 and direct the CDA to either the polywhip line 705 or the 90° fan 710. In addition, the three-way valve 715 can interrupt the flow of CDA received from the inlet port 325. For example, the selector switch 330 can be set to a first position wherein the three-way valve 715 is closed. Therefore, when the selector switch 330 is in the first position, no CDA will flow to either the polywhip line 705 or the 90° fan 710.

The selector switch 330 also can be set to a second position wherein the three-way valve 715 directs CDA through the distribution line 720a to the polywhip line 705. Therefore, when the selector switch 330 is in the second position, the polywhip line 705 will deliver CDA into the pedestal well 125. The polywhip line 705 randomly distributes the CDA into the pedestal well 125 in an unrestrained fashion. That is, the polywhip line 705 whips about within the well 125 similar in fashion to a manner in which a water hose would whip around when water is flowing and no one is holding the hose. Therefore, the polywhip line 705 stirs up the tungsten along the interior walls of the well 125 and sides of the pedestals 120.

The selector switch 330 also can be set to a third position wherein the three-way valve 715 directs CDA through the distribution line 720b to the 90° fan 710. Therefore, when the selector switch 330 is in the third position, the 90° fan 710 will deliver CDA into the pedestal well 125. The 90° fan 710 is dimensioned to extend into the well 125 such that the end of the 90° fan 710 is below the pedestal 120. The 90° fan 710 is configured to re-direct the CDA across a bottom of the pedestals 120.

Figure 8:
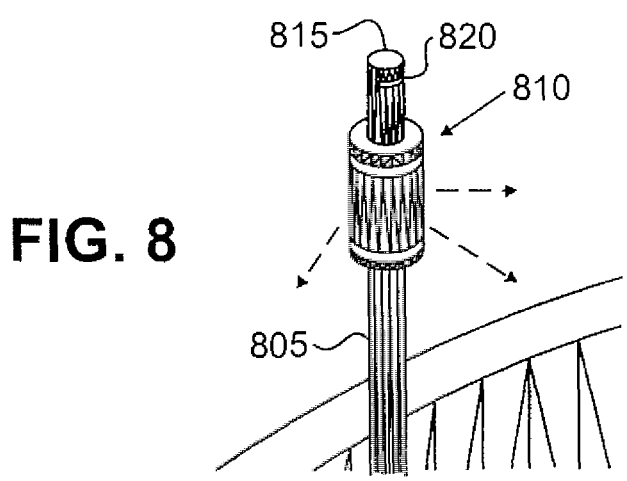
FIG. 8 illustrates a 90° fan according to embodiments of the present disclosure.

FIG. 8 illustrates a 90° fan according to embodiments of the present disclosure. The embodiment of the 90° fan 710 shown in FIG. 8 is for illustration only. Other embodiments could be used without departing from the scope of this disclosure.

The 90° fan 710 includes a hollow shaft 805. The shaft is rigid and can be made of aluminum, plastic, steal or the like. The shaft 805 can couple to the distribution line 720b. In some embodiments, the shaft 805 couples directly to the distribution line 720b. In some embodiments, the shaft 805 couples to the distribution line 720b through a junction terminal (not shown). A rotary fan 820 is coupled to the shaft 805 at a junction 810 connection. The rotary fan 820 is disposed at or near a bottom end 815 of the shaft. The rotary fan 820 can be an opening or plurality of opening disposed at or near a bottom end 815 of the shaft. The rotary fan 810 is configured to alter the direction of the CDA by 90°. That is, the CDA flows through the shaft 805 until it reaches the fan 820 and is redirected in a direction substantially perpendicular to the shaft 805. In some embodiments, the rotary fan 820 directs the CDA in an arc that is substantially directed towards the pedestal 120. In some embodiments, the rotary fan 810 directs the CDA in a 360° arc, that is, in all directions perpendicular to the shaft 805. In some embodiments, the fan 810 includes a small opening or series of openings that direct the CDA portions of the CDA in a single stream or series of streams that rotate radially about the shaft 810.

Figure 9:
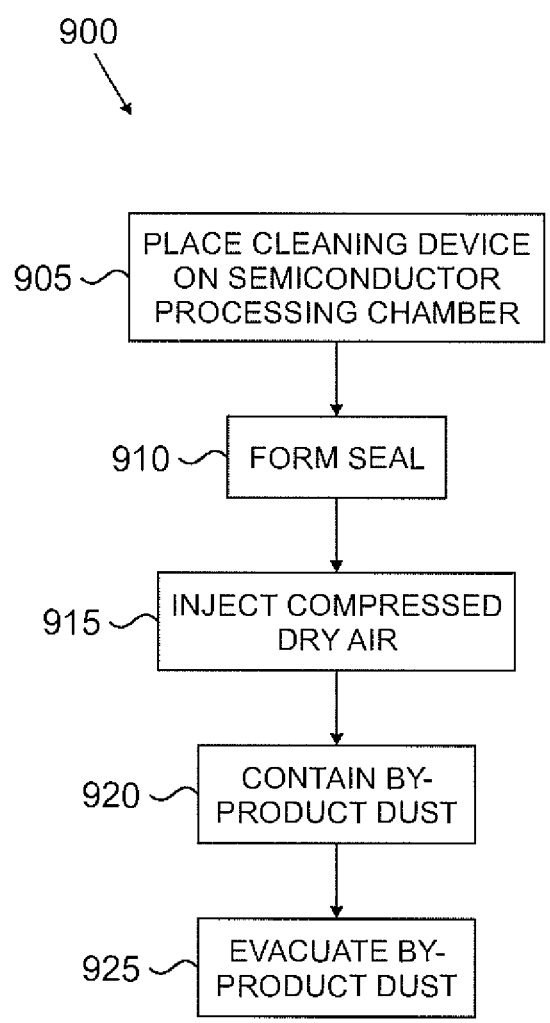
FIG. 9 illustrates a process for cleaning a semiconductor processing chamber according to embodiments of the present disclosure.

FIG. 9 illustrates a process for cleaning a semiconductor processing chamber according to embodiments of the present disclosure. The embodiment of the process 900 shown in FIG. 9 is for illustration only. Other embodiments could be used without departing from the scope of this disclosure.

In block 905, a cleaning apparatus is placed on the semiconductor processing chamber. For example, when it is determined that the semiconductor processing chamber needs to be cleaned, an operator can couple the rolandonator to the semiconductor processing chamber.

In block 910, a seal is formed between the cleaning apparatus and the semiconductor processing chamber. For example, when the rolandonator can include a number of O-rings, or a gasket, configured to create a seal between the rolandonator and the semiconductor processing chamber such that gas or other particles do not flow freely at the junction between the rolandonator and semiconductor processing chamber. In some embodiments, the rolandonator may include a fastening means, such as lock down bolts or clamps, to secure the rolandonator to the semiconductor processing chamber.

Thereafter, CDA, or any other suitable gas, is injected (sprayed) into the semiconductor processing chamber. The CDA can be sprayed in via a polywhip line or a 90° fan. The operator can vary spraying in the CDA by the polywhip line and a 90° fan. For example, the operator may initially spray in the CDA via the polywhip line, then spray the CDA using the 90° fan. It will be understood that the order of spraying is for illustration only and any order can be used and any number of iterations of each means, that is the polywhip line or the 90° fan, could be used without departing from the scope of this disclosure.

Byproduct dust agitated (stirred up) by the CDA is contained in block 920. For example, tungsten dust stirred up by the CDA can be contained within the pedestal well by the seal created between the rolandonator and the semiconductor processing chamber. Therefore, the tungsten dust cloud is inhibited from escaping from the semiconductor processing chamber into the environment.

In block 925, the byproduct dust stirred up by the CDA is evacuated. For example, the tungsten dust cloud can be evacuated by one or more vacuum ports. The vacuum ports may operate at the same time as the CDA is being injected (sprayed) into the pedestal well or the vacuum ports may operate at a time subsequent to the injecting of the CDA into the pedestal well. The operator can view the evacuation operation via a number of view ports.

The rolandonator 200 is configured to agitate and evacuate byproduct dust from a semiconductor processing chamber 100. The rolandonator 200 can inject, e.g., spray, a gas, such as CDA into a pedestal well 125 to agitate the byproduct, such as tungsten dust. As the CDA is delivered into the well 125 by cleaning nozzles, the CDA stirs up (agitates) the tungsten particles that have accumulated on the well 125 walls and sides of the pedestals 120. The rolandonator 200 also can evacuate the agitated byproduct dust from the semiconductor processing chamber 100. The rolandonator 200 includes vacuum ports 320 that can capture the tungsten dust that has been agitated by the polywhip lines 705, the 90° fans 710, or both. O-rings 515, 520 included in the rolandonator housing 305 form an air-tight seal around an annular gap 130. As such, the rolandonator 200 is able to contain the tungsten dust cloud within the pedestal well 125. Therefore, the rolandonator 200 can evacuate the tungsten dust inside the well 125 in a controlled fashion.

The embodiments and examples set forth herein are presented to best explain the present disclosure and its practical application and to thereby enable those skilled in the art to make and utilize the disclosed embodiments. However, those skilled in the art will recognize that the foregoing description and examples have been presented for the purpose of illustration and example only. The description as set forth is not intended to be exhaustive or to limit the disclosed embodiments to the precise form disclosed. Many modifications and variations are possible in light of the above teaching without departing from the spirit and scope of the following claims.

What is claimed is:

1. An apparatus for cleaning a semiconductor processing chamber, the apparatus comprising:
    a housing configured to cover an annular gap of a pedestal well of the semiconductor processing chamber;
    at least one cleaning nozzle configured to inject a gas into the pedestal well, such that the injected gas agitates a byproduct disposed on at least one surface within the housing, the at least one cleaning nozzle comprising a fan configured to deliver the gas to a specified portion of the pedestal well;
    at least one vacuum port configured to evacuate the agitated byproduct.

2. The apparatus of claim 1, wherein the at least one cleaning nozzle comprises a polywhip line configured to randomly distribute the gas.

3. The apparatus of claim 1, wherein the fan is a ninety-degree fan configured to deliver the gas at an angle substantially perpendicular to a wall of the pedestal well.

4. The apparatus of claim 1, wherein the at least one cleaning nozzle comprises a selector switch configured to select one of: a polywhip line; a ninety-degree fan, and closed position, wherein the closed position inhibits a flow of the gas into the pedestal well.

5. The apparatus of claim 1, wherein the housing comprises an O-ring configured to inhibit flow of the byproduct from the pedestal well.

6. The apparatus of claim 1, wherein the housing comprises at least one view port configured to enable an operator to view at least one of: the agitation of the byproduct and the evacuation of the byproduct.

7. The apparatus of claim 1, wherein the housing does not cover a center portion of a pedestal in the pedestal well of the semiconductor processing chamber.

8. A system for cleaning a semiconductor processing chamber, the system comprising:
    a housing configured to cover an annular gap of a pedestal well of the semiconductor processing chamber;
    at least one cleaning nozzle removably coupled to a compressed dry air (CDA) supply and configured to inject CDA into the pedestal well, such that the injected CDA agitates a byproduct disposed on at least one surface within the housing, the at least one cleaning nozzle comprises a fan configured to deliver the CDA to a bottom portion of a pedestal within the pedestal well;
    at least one vacuum port removably coupled to a vacuum source and configured to evacuate the agitated byproduct.

9. The system of claim 8, wherein the at least one cleaning nozzle comprises a polywhip line configured to randomly distribute the CDA.

10. The system of claim 8, wherein the fan is a ninety-degree fan configured to deliver the CDA at an angle substantially perpendicular to a wall of the pedestal well.

11. The system of claim 8, wherein the at least one cleaning nozzle comprises a selector switch configured to select one of: a polywhip line; a ninety-degree fan, and closed position, wherein the closed position inhibits a flow of the CDA into the pedestal well.

12. The system of claim 8, wherein the housing comprises an O-ring configured to form a seal at the junction between the housing and the semiconductor processing chamber in order to inhibit flow of the byproduct from the pedestal well.

13. The system of claim 8, wherein the housing comprises at least one view port configured to enable an operator to view at least one of: the agitation of the byproduct and the evacuation of the byproduct.

14. The system of claim 8, wherein the housing does not cover a center portion of a pedestal in the pedestal well of the semiconductor processing chamber.

15. The system of claim 8, further comprising the semiconductor processing chamber.

16. A method for cleaning a semiconductor processing chamber, the method comprising:
    covering, by a housing, an annular gap of a pedestal well of the semiconductor processing chamber;
    injecting, by at least one cleaning nozzle, a gas into the pedestal well;
    delivering, by a fan, the injected gas to a specified portion of the pedestal well;
    agitating, by the injected gas, a byproduct disposed on at least one surface within the housing;
    evacuating, by at least one vacuum port, the agitated byproduct.

17. The method of claim 16, wherein injecting comprises randomly distributing the gas by a polywhip line.

18. The method claim 16, wherein injecting comprises delivering the gas at an angle substantially perpendicular to a wall of the pedestal well.

19. The method of claim 16, wherein injecting comprises setting a cleaning nozzle to one of: a polywhip line; a ninety-degree fan, and closed position, wherein the closed position inhibits a flow of the gas into the pedestal well.

20. The method of claim 16, wherein containing comprises inhibiting, by an O-ring, a flow of the byproduct from the pedestal well.

\* \* \* \* \*